United States Patent [19]

Imai et al.

[11] Patent Number: 5,111,491

[45] Date of Patent: May 5, 1992

[54] X-RAY LITHOGRAPHY MASK AND METHOD FOR PRODUCING SAME

[75] Inventors: Takahiro Imai; Naoji Fujimori, both of Hyogo, Japan

[73] Assignee: Sumitomo Electric Industries, Ltd., Osaka, Japan

[21] Appl. No.: 747,950

[22] Filed: Aug. 21, 1991

[30] Foreign Application Priority Data

Aug. 28, 1990 [JP] Japan .................................. 2-226922

[51] Int. Cl.⁵ .............................................. G21K 5/00
[52] U.S. Cl. ........................................ 378/35; 378/210
[58] Field of Search ........................................... 378/35

[56] References Cited

U.S. PATENT DOCUMENTS 4,436,797 3/1984 Brady et al. .
4,604,292 8/1986 Evans et al. ........................... 427/39

FOREIGN PATENT DOCUMENTS 57-128031 8/1982 Japan .
58-204534 11/1983 Japan .
1-227433 9/1989 Japan .
1-227434 9/1989 Japan .
1-227435 9/1989 Japan .
1-60934 12/1989 Japan .

Primary Examiner—Craig E. Church
Attorney, Agent, or Firm—Cushman, Darby & Cushman

[57] ABSTRACT

An X-ray lithography mask comprising a X-ray transparent film made from diamond, X-ray absorber patterns deposited on the X-ray transparent film and diamond crosspieces shaped on the diamond X-ray transparent film for reinforcing the diamond X-ray transparent film. Since both the transparent film and the reinforcing crosspieces are made from diamond, no thermal stress is induced by the change of temperature. The mask excels in transmittance for X-ray, flatness and strength.

7 Claims, 3 Drawing Sheets

X-RAY LITHOGRAPHY MASK AND METHOD FOR PRODUCING SAME

FIELD OF THE INVENTION

This invention relates to an X-ray lithography mask which should be used for depicting micropatterns on semiconductor devices by X-ray lithography and the method for producing same: especially to such an X-ray lithography mask that excels in X-ray transparency, strength and flatness.

BACKGROUND OF THE INVENTION

The design rule (minimum line width of patterns) of semiconductor memory devices has attained to submicron order. The g-line (light) the of high pressure mercury lamps is still used for the light source of exposing photoresists in optical lithography. In order to raise the degree of integration of silicon semiconductor devices still higher, the i-line (light) of the high pressure mercury lamps or the ultra violet light of excimer lasers will be used as light sources of optical lithography in practical levels. In further future, the optical lithography will perhaps be replaced by X-ray lithography. If the X-ray lithography is employed, the light source will be replaced by X-ray sources. Since few materials can transmit X-rays without significant absorption, entirely new X-ray lenses, resists and lithography masks will be required in order to construct a new X-ray lithography.

A lot of X-ray lithography masks have been already proposed so far. An X-ray lithography mask in general consists of a supporter, an X-ray transparent film and X-ray absorber patterns. The requirements imposed on the X-ray lithography masks are, ① high transparency of the X-ray transparent film for X-rays and visible lights,
② flatness,
③ sufficient strength,
④ thinness,
⑤ little size change induced by the change of temperature.

A metal mask being a thin metal plate with holes perforated according to the desired patterns has no problem regarding the transparency for X-rays. But micropatterns cannot be depicted on a metal mask because of the technical restriction of cutting. The flatness of a metal mask is also insufficient, because a thin metal plate is likely to be bent owing to the lack of rigidity. In general, a metal mask does not satisfy the requirements ②, ③, ④ and ⑤.

Therefore, the desired X-ray lithography masks must have the structure comprising a transparent material and X-ray absorbers deposited on the transparent material. Then, the proposed X-ray lithography masks in general consist of a thin X-ray transparent film made of the material highly transparent for X-rays, X-ray absorbers deposited thereon having high absorption for X-rays, and a supporter for sustaining these parts.

The X-ray transparent films have been made from the materials consisting of light elements. For example, boron nitride films (BN), silicon nitride films (SiN), silicon carbonate films (SiC), silicon films (Si) and diamond films (C) have already been proposed as the X-ray transparent films.

Japanese Patent Publications NO. 1-60934, and No. 1-60935, Japanese Patent Laying Opens NO. 1-227433, NO. 1-227434, and No. 1-227435 have proposed X-ray lithography masks having the X-ray transparent films made from non-diamond materials, e.g. BN, SiN, SiC, Si. Among the non-diamond materials, SiN films, SiC films, Si films are inferior to other films consisting only of light elements in X-ray transparency, because they contain silicon which has inherently not so low X-ray transparency because of its atomic weight. Further, these films have so poor strength that more than 5 $\mu$m of thickness is required for practical use.

Thick films of the non-diamond materials have low transmittance also for visible light as well as for X-rays. Thus, thick films would bring about another difficulty of the mask alignment by visible light.

Diamond films are superior to the non-diamond films regarding transparency and strength. X-ray lithography masks having diamond films have been proposed by ① Japanese Patent Laying Open NO. 57-128031 (Aug. 9, 1982)
U.S. Pat. No.—4,436,797
② Japanese Patent Laying Open NO. 58-204534 (Nov. 29, 1983)

Diamond excels in X-ray transparency, strength, and transparency also for visible light. High transparency for visible light will facilitate the mask alignment. Diamond is inherently the most promising material for X-ray transparent films.

Although many excellences of diamond had been known well, diamond films had no practical significance for a X-ray lithography mask, because diamond films could not have been synthesized till late.

However, recent development of the CVD (Chemical Vapor Deposition) methods has enabled us to grow a diamond film on an adequate substrate. The following methods ③ to ⑤ of synthesizing diamond films have been disclosed so far;

③ Japanese Patent Laying Open NO. 58-135117 (Aug. 11, 1983)
Japanese Patent Publication NO. 61-2632
④ Japanese Patent Laying Open NO. 58-91100 (May 30, 1983)
Japanese Patent Publication NO. 59-27753
⑤ Japanese Patent Laying Open NO. 58-110494 (Jul. 1, 1983)
Japanese Patent Publication NO. 59-27754
⑥ Japanese Patent Laying Open NO. 1-123423 (Sep. 11, 1990)

The advant of these new synthesizing methods has heightened the practical value of diamond films in various fields of application. The methods have facilitated to fabricate such diamond films of the shape required for X-ray transparent films.

In such a X-ray lithography mask, the part through which X-ray will transmit should be only a diamond film. The diamond film of a mask must be thin enough to reduce the absorption of X-ray energy within a satisfactory extent. If it were so thin, the diamond film would be broken spontaneously, because it could not keep its shape by itself. On the contrary, too thick diamond would weaken the transmitting X-ray by absorbing most part of energy of X-rays and would be burnt away by the heat absorbed from the X-rays.

In the case of X-ray transparent windows, not X-ray masks, we have proposed diamond films reinforced by many longitudinal and vertical crosspieces in, ⑦ Japanese Patent Application NO. 1-308173
EP-365366
⑧ Japanese Patent Application NO. 1-308174

Document (7) has proposed an X-ray transparent window of diamond film on which silicon parallel crosspieces are formed lengthwise and crosswise. Document (8) has proposed an X-ray transparent window of diamond film on which nickel or chromium parallel crosspieces are formed in the same manner. The X-ray window proposed by (7) is made by growing a diamond film on a silicon substrate and etching away most parts of the silicon substrate so as that lattice crosspieces and a peripheral part are reserved.

FIG. 2 shows a proposed X-ray mask having silicon crosspieces for reinforcing the diamond film. An X-ray transparent film (1) is made from diamond. This X-ray transparent film (1) is deposited on a silicon substrate (3). After the diamond film (1) is grown on the silicon substrate (3), most parts of the silicon substrate (3) are etched away except lattice parts and a periphery. Thus, lattice crosspieces and a periphery of silicon are reserved on the diamond X-ray film (1). An annular supporter (5) is fitted on the peripheral part of the silicon substrate (3). Then, X-ray absorber patterns (4), e.g. made from gold (Au) are deposited on the X-ray transparent film (1).

Besides silicon, a molybdenum substrate can be used as a substrate on which a diamond film is grown. In this case the central part of the molybdenum substrate is eliminated by etching. If some reinforcing crosspieces were left at the etching process, the crosspieces would be made of molybdenum, although such a mask having molybdenum reinforcing crosspieces has never proposed yet.

As mentioned so far, most of the current X-ray windows have no reinforcing crosspieces on the transparent film, because the transparent films are thick enough. A few current X-ray masks have reinforcing crosspieces. In these X-ray masks, the materials of the reinforcing crosspieces are exactly the same as that of the substrate, e.g. silicon (Si), molybdenum (Mo), nickel (Ni) or chromium (Cr). The reinforcing crosspieces can easily be made only by selectively etching away unnecessary parts of the substrate. Thus, the reinforcing crosspieces and the peripheral annular part of the substrate are shaped up at the same time.

Diamond has a thermal expansion coefficient smaller than that of the materials of the substrate, e.g. silicon or molybdenum on which diamond is grown. The growth of diamond generally requires the high temperature more than 600° C. Since the reinforcing crosspieces are made at so high temperature that strong thermal stress would occur between the reinforcing crosspieces and the diamond film after cooling to the room temperature. The strong thermal stress is likely to distort the X-ray mask. Thus, it is difficult to produce an X-ray mask favored with flatness.

The purpose of this invention is to provide an X-ray mask which excels in X-ray transmittance, flatness and strength.

SUMMARY OF THE INVENTION

An X-ray mask of this invention has diamond reinforcing crosspieces on a surface of a diamond transparent film. The feature of this invention is that the reinforcing crosspieces are made from diamond instead of the same materials of the substrate on which diamond is grown. It is desirable that the diamond reinforcing crosspieces are thicker than the diamond transparent film.

Another construction is the same as the conventional X-ray masks. X-ray absorber patterns in accordance with the purpose will be mounted on another surface of the diamond film. The substrate on which the diamond film has been grown is partially etched away from its rear surface except a peripheral annular part. The residual annular part acts as an annular frame. A ring supporter is glued to the annular frame. Otherwise, it is also possible to etching all the substrate away and to glue a ring supporter directly to the peripheral part of the diamond film.

Since the material of the reinforcing crosspieces is diamond in common with that of the transparent film, no thermal stress occurs between the X-ray transparent film and the reinforcing crosspieces. The X-ray mask will not deform because of no occurrence of thermal stress. An X-ray mask with high flatness is obtained by this invention.

The advantages of this invention will be now explained.

(1) Since the reinforcing crosspieces are made from diamond which is the same material as the transparent film, no thermal stress is induced between the transparent film and the reinforcing crosspieces by the change of temperature. This feature ensures high flatness of the X-ray mask of this invention.

(2) Since the reinforcing crosspieces are made from diamond which is highly transparent to X-rays, the X-ray transmittance even at the parts on which the reinforcing crosspieces exist is sufficiently high.

(3) Since the transparent film is also made of diamond, the X-ray transmittance on which no reinforcing crosspieces exist is quite high because of the thinness of the diamond transparent film.

(4) Since the diamond transparent film is reinforced by the diamond crosspieces, the X-ray mask of this invention is endowed with high strength.

DETAILED DESCRIPTION OF THE EMBODIMENTS

Figure 1:
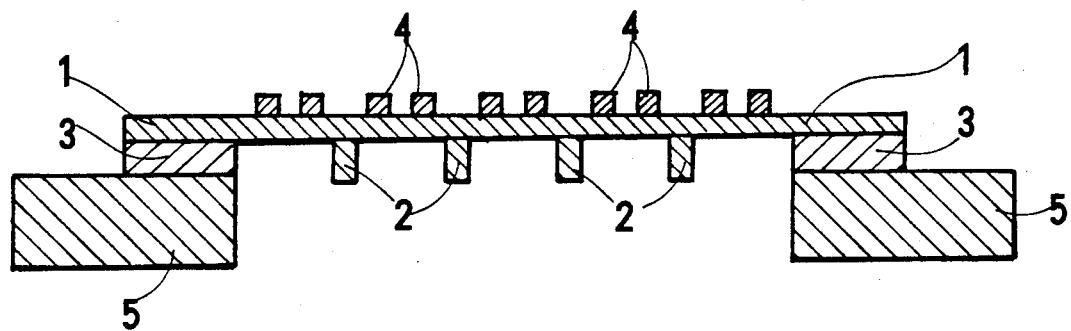
FIG. 1 is a sectional view of an X-ray lithography mask as an embodiment of this invention.
Figure 2:
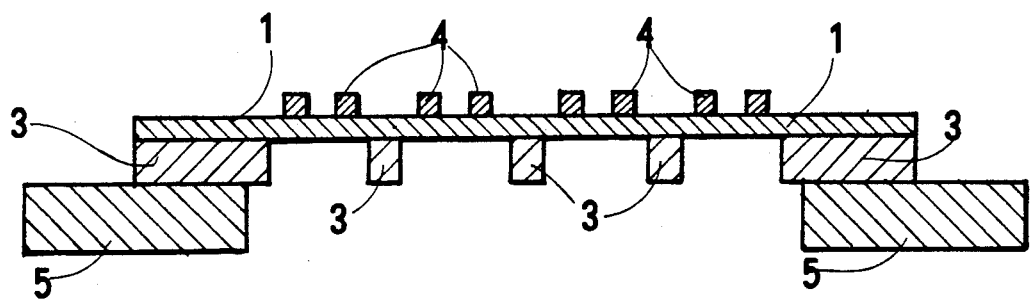
FIG. 2 is a sectional view of a conventional X-ray lithography mask.

An example of an X-ray lithography mask of this invention is now explained by referring to FIG. 1. An X-ray transparent film (1) is a diamond film. Reinforcing crosspieces (2) are deposited on the central part of a surface of the X-ray transparent film (1). An annular substrate (3) remains on the peripheral part of the surface of the X-ray transparent film (1). A bigger ring supporter (5) is stuck to the bottom surface of the annular substrate (3). X-ray absorber patterns made of the material with high absorption for X-ray, e.g. gold (Au) are deposited on the X-ray transparent film (1) according to the predetermined patterns of the mask. The substrate (3) was required to be a substrate on which the diamond transparent film (1) has been grown. In this example, the central part of the substrate (3) has been etched after the diamond transparent film (1) was grown thereon. Thus, an annular part of the substrate (3) is left over behind. The material of the substrate (3) should satisfy the requirements of;

(1) High heat resistance, because it must stand against the temperature higher than 600° C. in which diamond can be synthesized,
(2) Facile processing, and
(3) Good flatness.

Semiconductors Si, Ge, GaAs or high-melting point metals Mo, W are appropriate to the material of the substrate (3) in compliance with the requirements.

The surface of the substrate on which diamond will be grown must be mirror-polished for the requirement of flatness. It is also profitable to polish the substrate material by fine diamond powder with the diameter shorter than 10 $\mu$m to control the grain size of diamond crystals in growth.

The reinforcing crosspieces (2) are mounted on the same surface to which the substrate (3) is stuck in this example. But the reinforcing crosspieces (2) may also mounted on the reverse surface of the substrate. In this version, the X-ray absorber patterns shall be deposited on the same surface to which the annular substrate (3) is glued.

In the first example, a part of the substrate (3) remains. However, the substrate may be completely eliminated after the growth of diamond. The second example without substrate is now explained by referring to FIG. 3. An X-ray transparent film (1) is made from diamond. The silicon substrate on which the diamond transparent film (1) was grown has been completely eliminated. A ring supporter (5) is directly glued to the peripheral part of the rear surface of the diamond X-ray transparent film (1). Further, X-ray absorber patterns (4) are deposited on the same surface of the X-ray transparent film (1) from which the silicon substrate was eliminated. Reinforcing crosspieces (2) are mounted lengthwise and crosswise or obliquewise on the front surface of the diamond X-ray transparent film (1). This second example succeeds in eliminating the thermal stress which used to be induced by the difference of thermal expansion coefficients between the silicon substrate and the diamond X-ray transparent film, because the silicon substrate was perfectly etched away.

The geometric shape of the crosspieces should be arbitrarily chosen. Most simple shape is a rectangular lattice which consists of parallel longitudinal members and parallel vertical members. Since the crosspieces are fitted on the transparent film for reinforcing it, it is desirable that each crosspiece continues long enough in some directions. Instead of or in addition to the longitudinal or vertical crosspieces, oblique crosspieces will also be available. Otherwise, periodical repetition of regular polygons can be adopted as another shape of crosspieces. For example, the repetition of regular triangles is possible for the alignment of crosspieces. The repetition of regular hexagons is also available.

The "diamond" constituting the X-ray transparent film and the crosspieces of this invention signifies the carbon in which the existence of crystalline diamond is confirmed at least partially by the Raman scattering spectrometry. It is allowable that the film or the crosspieces include graphite, amorphous carbon, quasi-diamond carbon as non-diamond carbon ingredient to some extent.

Besides carbon ingredients, the "diamond" of the transparent film or the crosspiece of this invention may include a small amount of impurities, e.g. boron (B), nitrogen (N), oxygen (O), aluminum (Al), silicon (Si), phosphor (P), titanium (Ti), tungsten (W), tantalum (Ta), iron (Fe) or nickel (Ni). Especially, the inclusion of a very small amount of boron (B) converts an insulator diamond to a semiconductor diamond. Since the conductivity is raised by the boron inclusion, electrification (or charge-up) of the transparent film or the crosspieces which would surely be induced on an insulator irradiated by X-rays can be effectively suppressed.

The method for producing the X-ray lithography mask of this invention will now be explained by referring to FIG. 4 and FIG. 5.

METHOD 1

Figure 4:
FIGS. 4a–4h are a sequence of sectional views showing the steps for fabricating an X-ray lithography mask of this invention.
Figure 4:
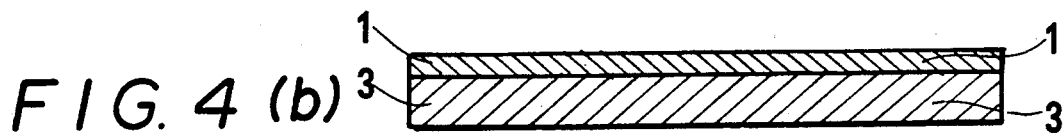
Figure 4:
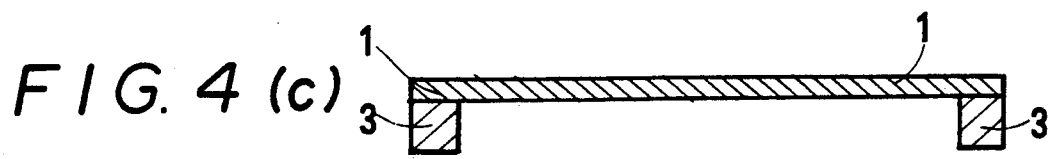
Figure 4:
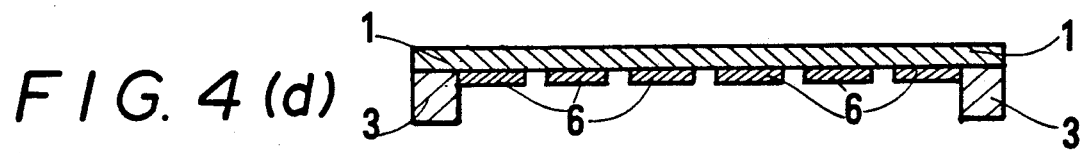
Figure 4:
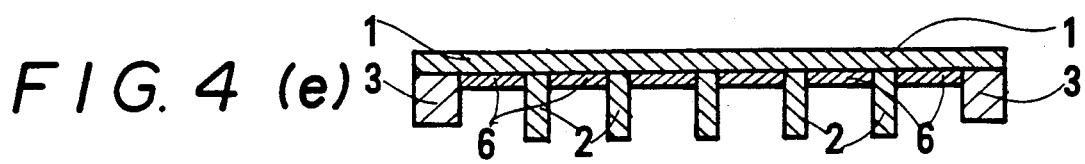
Figure 4:
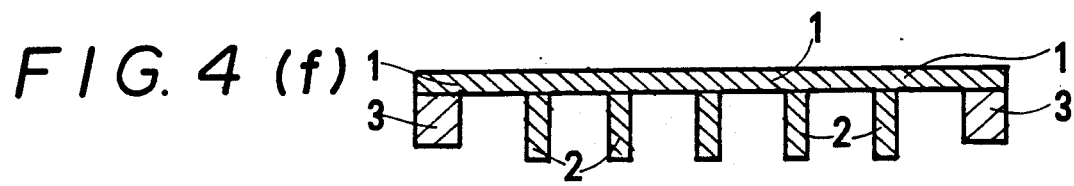
Figure 4:
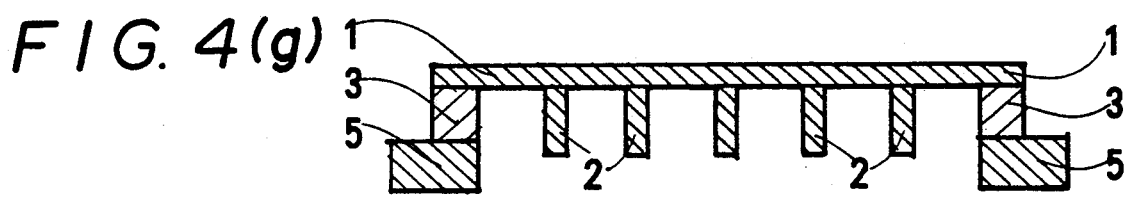
Figure 4:
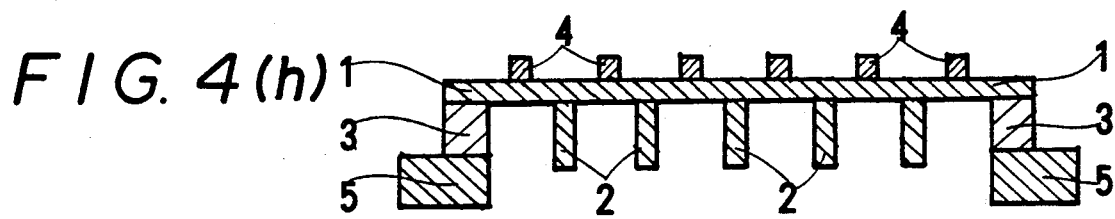

Demonstrated by FIG. 4

(a) A flat substrate (3), e.g. silicon (Si), germanium (Ge), gallium arsenide (GaAs), molybdenum (Mo) or tungsten (W) is mirror-polished as described before.

(b) A diamond film is grown on the substrate (3) by a vapor phase synthesis method. The diamond film synthesized becomes a X-ray transparent film (1). The vapor phase synthesis method means such a method including the steps of supplying a material gas including hydrogen, methane, etc. on a heated substrate, exciting the gas molecules and the substrate by some means for inducing vapor phase reaction, and depositing the reaction product on the substrate.

Different vapor phase synthesis methods with different means for exciting the material gas have been so far proposed for producing films of various materials.

The vapor phase synthesis methods proposed for synthesizing diamond films are a thermal CVD method (Japanese Patent Laying Open No. 58-91100), a plasma CVD method (Japanese Patent Laying Open No. 58-135117, Japanese Patent Laying Open No. 58-110494), an ion beam method, a laser CVD method and a burner flame method. Among them, especially the thermal CVD method and the plasma CVD methods are promising, because of high uniformity of diamond growth.

Since the diamond film growth by the methods will become an X-ray transparent film, the thickness of the diamond film should be determined by the range of wavelength of X-rays, the required transmittance of X-rays and the mechanical strength required for a mask. In general, the restriction of the transmittance needed for sufficient X-ray exposure requires a thickness shorter than 20 $\mu$m. On the contrary, a thickness longer than 0.05 $\mu$m is required for ensuring the mechanical strength. According to the requirements, the thickness of the diamond film should be 0.05 $\mu$m to 20 $\mu$m.

(c) Central part of the substrate (3) is perfectly etched away till the X-ray transparent film (1) becomes exposed. The peripheral annular part of the substrate (3) remains.

(d) A diamond-growth-inhibiting mask (6) having long holes at the positions on which crosspieces will be formed is deposited on the central part of either surface of the X-ray transparent film (1). The diamond-growth-inhibiting mask (6) is fabricated by evaporation-coating whole of the surface of the X-ray transparent film (1) with pertinent material, e.g. tungsten (W), molybdenum (Mo), silicon (Si), germanium (Ge), nickel (Ni), chromium (Cr) or titanium (Ti) and eliminating parts of the coated material at the positions on which crosspieces will be formed by photolithography.

In this example, the diamond-growth-inhibiting mask (6) is fabricated on the central part of the rear surface. However, the diamond-growth-inhibiting mask (6) may be fabricated on whole of the front surface of the film (1). By the version the X-ray mask shown in FIG. 3 will be obtained.

(e) Diamond is grown on the rear surface covered with the diamond-growth-inhibiting mask (6) by a vapor phase synthesis method. Diamond is deposited only in the holes of the mask (6), because the diamond X-ray transparent film (5) is exposed only at the holes. Diamond is not grown on the mask (6), because the mask material inhibits diamond from growing. It is important that annisotropic (vertical) growth of diamond continues vertically far beyond the thickness of the diamond-growth-inhibiting mask (6). The diamond grown annisotropically on the film (1) will become diamond reinforcing crosspieces. Japanese Patent Laying Open No. 1-123423 has disclosed the method of selective diamond growth by such a diamond-growth-inhibiting mask.

(f) The diamond-growth-inhibiting mask (6) is eliminated away by an etchant including acid or alkali.

(g) The peripheral annular part of the substrate (3) remains on the periphery of the transparent film (1). Unlike conventional mask, the height of the residual substrate (3) is not same as that of the crosspieces. A ring supporter (5) is glued to the bottom surface of the annular part of the substrate (3). The ring supporter (5) is made from the material with rigidity, e.g. aluminum, stainless steel or ceramics.

(h) X-ray absorber patterns (4) made from the material with high absorption for X-rays, e.g. gold (Au), tungsten (W) are deposited on the X-ray transparent film (1) in coincidence with the desired mask patterns. Thus, an X-ray lithography mask of this invention is produced by the steps mentioned above.

METHOD 2

Figure 5:
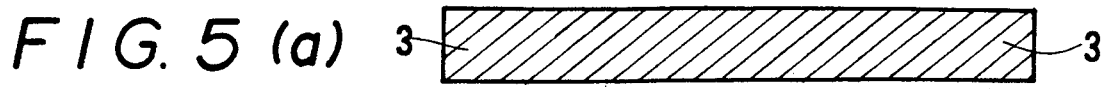
FIGS. 5a–5g are a sequence of sectional views showing the steps for fabricating another X-ray lithography mask of this invention.
Figure 5:
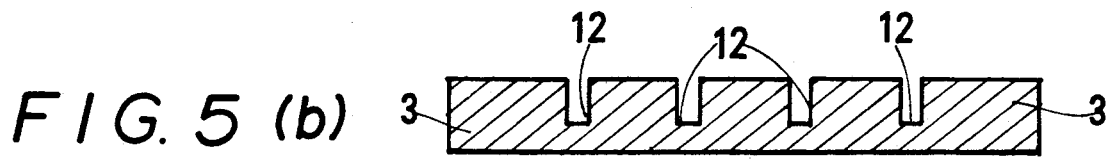
Figure 5:
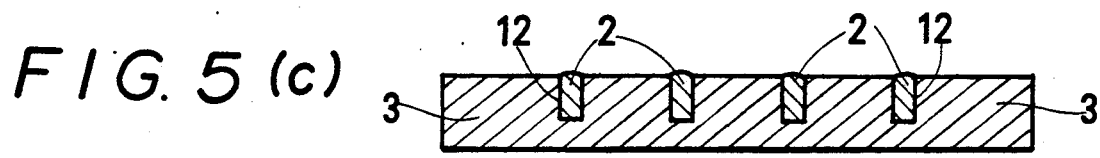
Figure 5:
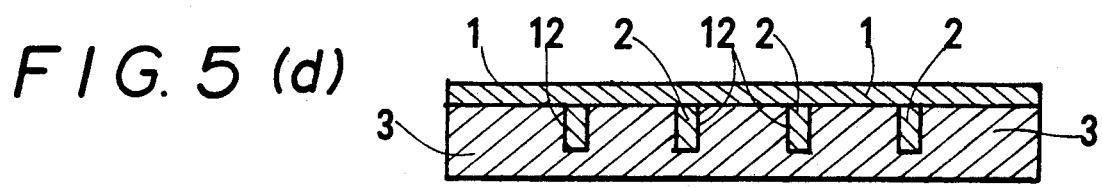
Figure 5:
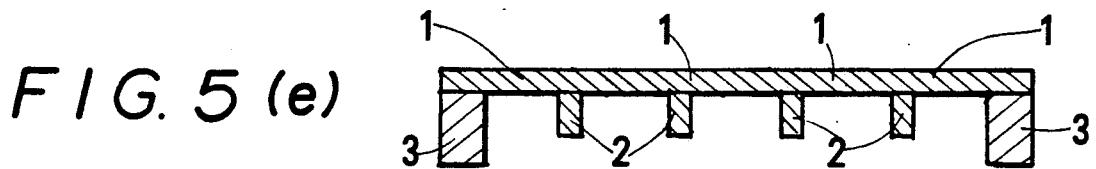
Figure 5:
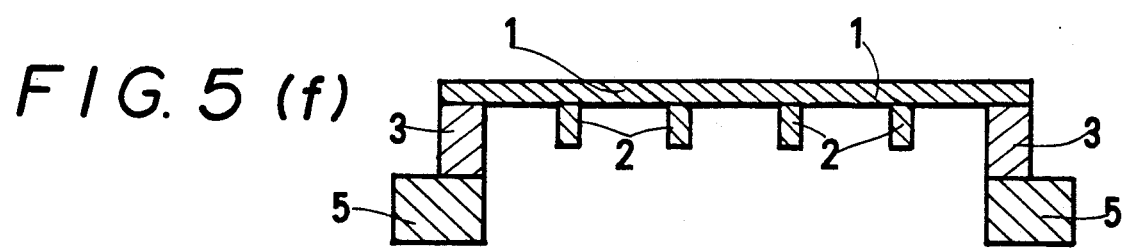
Figure 5:
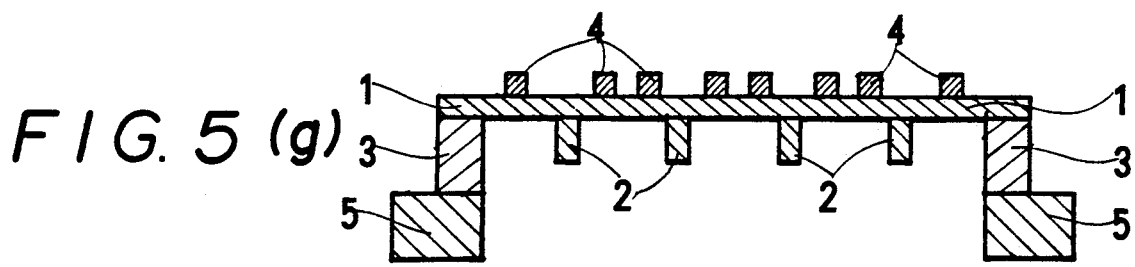

Demonstrated in FIG. 5

(a) A substrate (3) made from silicon (Si), germanium (Ge), gallium arsenide (GaAs), molybdenum (Mo) tungsten (W) or so on is mirror-polished.

(b) Grooves (12) are dug at the positions on which crosspieces will be mounted on a surface of the substrate (3). Both dry etching and wet etching are available for digging the grooves. Since the crosspiece shall have a height of 5 $\mu$m to 100 $\mu$m and a width of 10 $\mu$m to 2000 $\mu$m, the grooves (12) corresponding to the crosspieces are shallow enough.

(c) Diamond is grown in the grooves (12) of the substrate (3) by a vapor phase synthesizing method. The diamond grown in the grooves will become the crosspieces. For selective growth of diamond, it is desirable to grow diamond on the surface, after all parts except the grooves have been covered by a pertinent mask.

(d) A diamond film is grown on whole of the surface of the substrate (3) by a vapor phase synthesizing method. The diamond film becomes an X-ray transparent film (1).

(e) Central part of the substrate (3) is fully etched away from the rear surface. A peripheral part remains. Since diamond resists against the etching, the diamond parts filled in the grooves (12) are entirely revealed. The revealed parts of the diamond become crosspieces for reinforcing the diamond film.

(f) A ring supporter (5) is stuck to the periphery of the substrate (3).

(g) X-ray absorber patterns (4) are formed on the diamond X-ray transparent film (1) by depositing a metal, e.g. gold (Au), tungsten (W), or molybdenum (Mo) and selectively eliminating parts of the metals by photolithography. Thus, another X-ray mask of this invention is fabricated by the steps.

An X-ray mask with a residual substrate (3) shown in FIG. 1 can be produced by the methods shown in FIG. 4 and FIG. 5.

Figure 3:
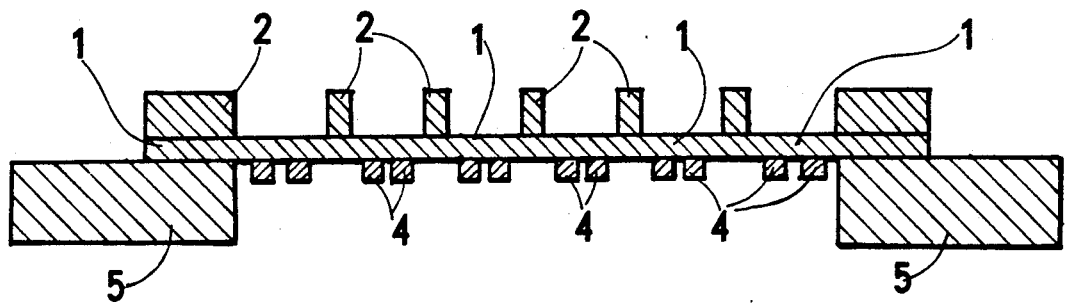
FIG. 3 is a sectional view of an X-ray lithography mask as another embodiment of this invention.

Another X-ray mask without substrate shown in FIG. 3 can also be produced by the methods slightly modified from ones shown in FIG. 4 and FIG. 5.

The X-ray mask of FIG. 3 is produced by the following steps similar to ones of FIG. 4. First, a diamond film is grown on a substrate (3). A diamond-growth-inhibiting mask is deposited on the diamond film. Another diamond film is grown on the diamond-growth-inhibiting mask by a vapor phase deposition method. The diamond-growth-inhibiting mask is eliminated. A three layered structure consisting of the substrate, the diamond film and the diamond reinforcing crosspieces is obtained. Then whole of the substrate is eliminated. X-ray absorber patterns are deposited on the surface of the diamond film revealed by the elimination of the substrate. A ring supporter (5) is stuck to the periphery of the same surface of the diamond film.

The same X-ray mask of FIG. 3 is otherwise produced by the following steps similar to ones shown in FIG. 5.

Grooves which correspond to the crosspieces to be made and a peripheral annular groove are bored on the surface of a substrate (3). Diamond is grown on the substrate (3) by a vapor phase deposition method. The diamond is deposited in the grooves of the crosspieces and in the peripheral groove. After the grooves have been filled with diamond, diamond is again grown in uniform thickness on the substrate. The former diamond will be reinforcing crosspieces. The latter diamond will be an X-ray transparent film. X-ray absorber patterns are shaped on the latter diamond film. A ring supporter (5) is stuck to the periphery of the diamond film. Whole of the substrate is etched away by dry etching or wet etching. Then, an X-ray mask shown in FIG. 3 is obtained by the steps like FIG. 5.

EMBODIMENT

An X-ray lithography mask was produced by the method shown in FIG. 4. The substrate was a silicon wafer with a diameter of 75 mm$\phi$ and a thickness of 0.5 mm. One surface of the silicon wafer was mirror-polished. Diamond was deposited up to 4.5 $\mu$m on the mirror-polished surface of the silicon wafer by the microwave plasma CVD method using methane gas (CH$_4$) and hydrogen gas (H$_2$) as a material gas.

The diamond film grown was confirmed to be crystalline diamond having a 1333 cm$^{-1}$ peak in the Raman scattering spectrum by the Raman scattering spectrometry.

A peripheral part of the rear surface of the silicon wafer was covered with photoresist. The central part of the diameter of 60 mm$\phi$ of the silicon wafer is not covered with the photoresist. The uncovered central part of the silicon wafer was perfectly etched away by fluoric-nitric acid.

Molybdenum was evaporated through a metal mask on the diamond surface exposed by the etching to make a diamond-growth-inhibiting mask. The metal mask has the groove patterns same as the crosspieces to be made.

Diamond was again grown through the diamond-growth-inhibiting mask on the diamond film by the microwave plasma CVD method. Diamond was selectively deposited on the grooves of the mask. The diamond patterns had a width of 2 mm and a height of 80 μm. The diamond patterns were the crosspieces for reinforcing the diamond film.

Then the diamond-growth-inhibiting mask of molybdenum was etched away by aqua regia. An aluminum ring supporter (5) was stuck to the silicon substrate remaining on the periphery of the diamond film. X-ray absorber patterns made of gold (Au) were deposited on another surface of the diamond film.

An X-ray resist was exposed through this X-ray mask by X-rays. Then the resist was developed. The desired resist patterns which exactly reconstructed the X-ray mask patterns was obtained.

The X-ray lithography mask of this invention excels in X-ray transmittance, flatness and mechanical strength, because it has an X-ray transparent film made from diamond and crosspieces made from diamond for reinforcing the diamond transparent film.

What we claim is:

1. An X-ray lithography mask comprising an X-ray transparent film made from diamond, X-ray absorber patterns made of materials with high absorption for X-rays and deposited on the X-ray transparent film and diamond crosspieces deposited on the X-ray transparent film for reinforcing the X-ray transparent film.

2. An X-ray lithography mask comprising an X-ray transparent film made from diamond, a ring substrate fitted to a periphery of the X-ray transparent film, X-ray absorber patterns made of materials with high absorption for X-rays and deposited on the X-ray transparent film and diamond crosspieces deposited on the X-ray transparent film for reinforcing the X-ray transparent film.

3. An X-ray lithography mask comprising an X-ray transparent film made from diamond, a ring substrate fitted to a periphery of the X-ray transparent film, X-ray absorber patterns made of materials with high absorption for X-rays and deposited on the X-ray transparent film, diamond crosspieces deposited on the X-ray transparent film for reinforcing the X-ray transparent film and a ring supporter fixed to the ring substrate.

4. An X-ray lithography mask comprising an X-ray transparent film made from diamond, diamond crosspieces deposited on the X-ray transparent film for reinforcing the X-ray transparent film for reinforcing the X-ray transparent film, X-ray absorber patterns made of materials with high absorption for X-rays and deposited on the X-ray transparent film and a ring supporter fitted to periphery of the X-ray transparent film.

5. An X-ray lithography mask comprising an X-ray transparent film made from diamond, diamond crosspieces depositing on the X-ray transparent film for reinforcing the X-ray transparent film, X-ray absorber pattern made of materials with high absorption for X-rays and deposited on the X-ray transparent film and a ring supporter fitted to periphery of the diamond crosspieces.

6. A method for producing an X-ray lithography mask comprising steps of:

growing a diamond film as an X-ray transparent film on a substrate by a vapor deposition method, eliminating a central part of the substrate till the diamond film exposes, forming a diamond-growth-inhibiting mask which covers only parts on which crosspieces will be deposited on the exposed part of the X-ray transparent film, growing a reinforcing diamond film on the diamond X-ray transparent film covered with the diamond-growth-inhibiting mask, eliminating the diamond-growth-inhibiting mask and depositing X-ray absorber patterns made from material with high absorption to X-rays on the X-ray transparent film.

7. A method for producing an X-ray lithography mask comprising steps of:

boring grooves on which crosspieces will be made on a surface of a substrate, growing a reinforcing diamond film on the surface with the grooves of the substrate by a vapor phase deposition method, growing another film as an X-ray transparent film on the surface with the grooves filled with the diamond of the substrate by a vapor phase deposition method, eliminating the substrate except a peripheral part till the diamond filled in the grooves is fully exposed and depositing X-ray absorber patterns made from material with high absorption to X-rays on the other surface of the X-ray transparent film.

* * * * *